US008835196B2

(12) United States Patent
Shima

(10) Patent No.: US 8,835,196 B2
(45) Date of Patent: Sep. 16, 2014

(54) METHOD FOR PRODUCING TRANSPARENT CONDUCTIVE FILM AND METHOD FOR MANUFACTURING SOLAR CELL

(71) Applicant: Sanyo Electric Co., Ltd., Moriguchi (JP)

(72) Inventor: Masaki Shima, Uji (JP)

(73) Assignee: SANYO Electric Co., Ltd., Moriguchi (JP)

( * ) Notice: Subject to any disclaimer, the term of this patent is extended or adjusted under 35 U.S.C. 154(b) by 0 days.

(21) Appl. No.: 14/029,045

(22) Filed: Sep. 17, 2013

(65) Prior Publication Data

US 2014/0017849 A1    Jan. 16, 2014

Related U.S. Application Data

(63) Continuation of application No. PCT/JP2012/055906, filed on Mar. 8, 2012.

(30) Foreign Application Priority Data

Mar. 24, 2011  (JP) ................. 2011-066720

(51) Int. Cl.
| H01L 21/00 | (2006.01) |
| H01L 31/0224 | (2006.01) |
| C23C 14/14 | (2006.01) |
| C23C 14/58 | (2006.01) |
| C23C 14/24 | (2006.01) |
| H01L 31/18 | (2006.01) |
| C23C 14/56 | (2006.01) |
| H01L 31/0747 | (2012.01) |
| C23C 14/00 | (2006.01) |

(52) U.S. Cl.
CPC ........ *H01L 31/022466* (2013.01); *C23C 14/14* (2013.01); *C23C 14/5806* (2013.01); *C23C 14/24* (2013.01); *Y02E 10/50* (2013.01); *H01L 31/1884* (2013.01); *C23C 14/56* (2013.01); *H01L 31/0747* (2013.01); *C23C 14/0015* (2013.01)
USPC .................... 438/22; 438/24; 438/48; 438/85

(58) Field of Classification Search
USPC ............. 438/22, 24, 48, 85, 104; 257/79, 84, 257/414, 431
See application file for complete search history.

(56) References Cited

U.S. PATENT DOCUMENTS

| 6,399,411 | B1 * | 6/2002 | Hori et al. ....................... 438/62 |
| 6,576,061 | B1 * | 6/2003 | Moriyama et al. ............ 118/719 |
| 7,425,296 | B2 * | 9/2008 | Cochran et al. ................ 264/458 |
| 8,043,885 | B2 * | 10/2011 | Terakawa et al. ............... 438/96 |
| 2012/0213949 | A1 * | 8/2012 | Weng et al. ................... 427/576 |

FOREIGN PATENT DOCUMENTS

| JP | 2005-353505 A | 12/2005 |
| JP | 2006-286308 A | 10/2006 |

* cited by examiner

*Primary Examiner* — Hsien Ming Lee
(74) *Attorney, Agent, or Firm* — Marvin A. Motsenbocker; MOTS LAW, PLLC

(57) ABSTRACT

The purpose of the present invention is to favorably modify a transparent conductive film and provide a transparent conductive film with few grain boundaries. In the manufacturing method for the transparent conductive film of the present invention, a transparent conductive film 3 is formed on a substrate 2 inside a vacuum chamber 10, after which radiant heat is imparted from a surface modifying device 4 arranged near the substrate 2 to modify the transparent conductive film 3, and the substrate 2 having the modified transparent conductive film 3 is removed from the vacuum chamber 10.

17 Claims, 2 Drawing Sheets

METHOD FOR PRODUCING TRANSPARENT CONDUCTIVE FILM AND METHOD FOR MANUFACTURING SOLAR CELL

CROSS-REFERENCE TO RELATED APPLICATIONS

This is a continuation of International Application PCT/JP2012/055906, with an international filing date of Mar. 8, 2012, filed by applicant, the disclosure of which is hereby incorporated by reference in its entirety.

FIELD OF THE INVENTION

The present invention relates to a manufacturing method for a transparent conductive film and a manufacturing method for solar cells.

BACKGROUND

Transparent conductive film comprising transparent conductive oxides such as zinc oxide and indium oxide film is used as an electrode in various types of devices such as solar cells and liquid crystal panels.

Various methods have been proposed for improving the performance of and reducing resistance in transparent conductive film. For example, a method has been disclosed in Patent Document 1 in which a substrate on which indium oxide film has been formed is exposed to infrared radiation from an infrared lamp via a tube to improve the crystallinity of the indium oxide film.

CITED DOCUMENTS

Patent Documents

Patent Document 1: Laid-Open Patent Publication No. 2005-353505

SUMMARY

Problem Solved by the Invention

In patent document 1, the indium oxide film is formed on a substrate, after which the substrate is removed from the film-forming device and the indium oxide film is exposed to infrared radiation using an infrared lamp. In this method, the indium oxide film is exposed to air after the indium oxide film is formed. As a result, the surface of the indium oxide film may become oxidized and other impurities may adhere to the surface of the indium oxide film. Impurities on the surface of the film may obstruct modification of the film via infrared irradiation.

The purpose of the present invention is to favorably modify a transparent conductive film and provide a transparent conductive film with few grain boundaries.

Means of Solving the Problem

In the manufacturing method for transparent conductive film in the present invention, a transparent conductive film is formed inside a vacuum chamber, after which the transparent conductive film is modified without being exposed to air.

Effect of the Invention

Because the substrate is not exposed to air until modification of the transparent conductive film has been completed, the modification process is favorably performed without the possibility of the surface of the transparent conductive film being oxidized or of other impurities adhering to the surface.

DETAILED DESCRIPTION

Figure 1:
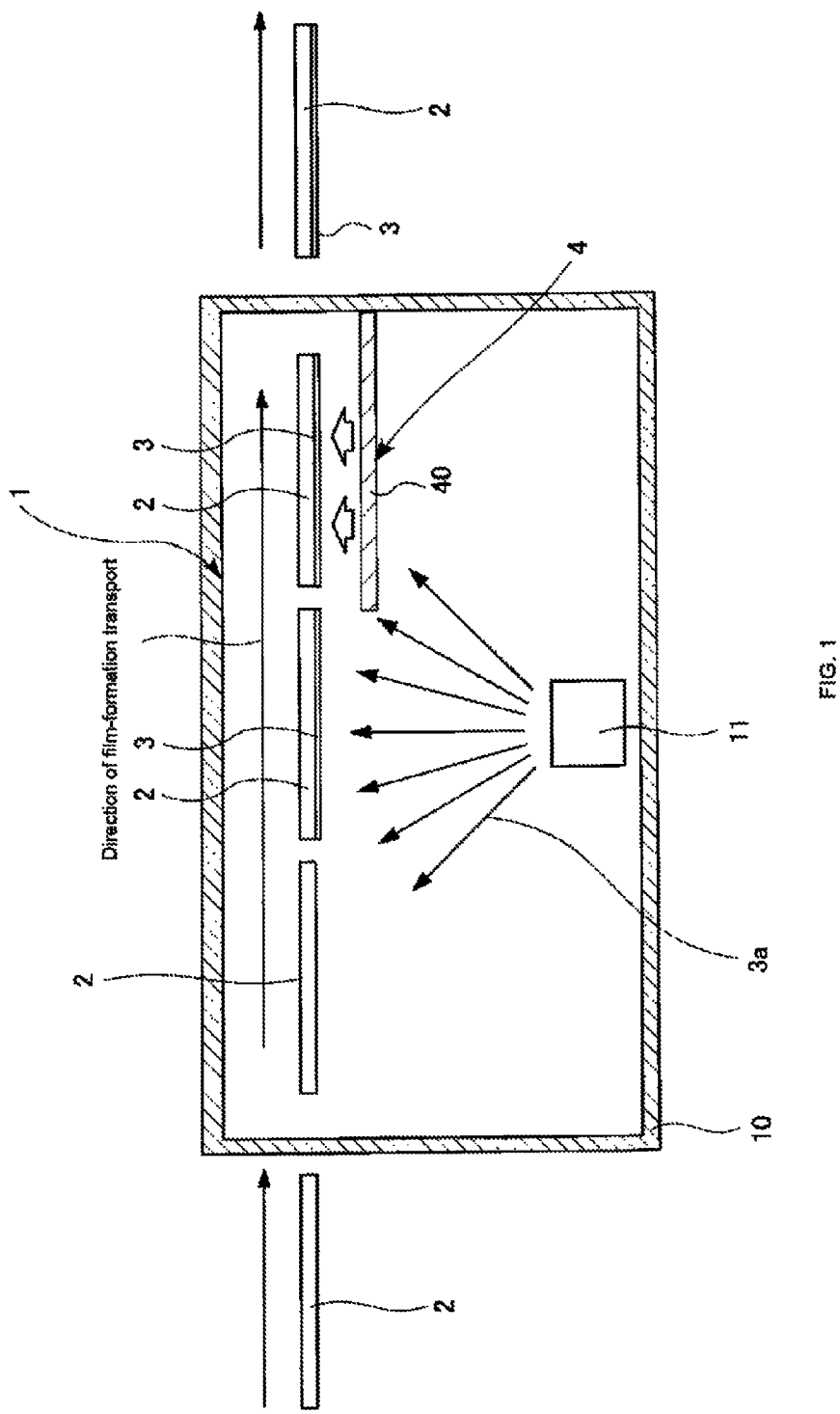
FIG. 1 is a schematic diagram showing the film-forming device used in an embodiment.

The following is a detailed explanation of an embodiment of the present invention with reference to the drawings. Identical or similar components in the drawings are denoted by the same reference signs and repeated explanation of these components has been omitted in order to avoid redundancy.

The transparent conductive film used in the embodiment is made of a transparent conductive oxide such as indium oxide, zinc oxide, or tin oxide. These transparent conductive oxides contain a dopant. When the transparent conductive film comprises indium oxide, the dopant is selected from among hydrogen, tin, tungsten, cerium, zirconium, hafnium, titanium, and niobium. When the transparent conductive film comprises zinc oxide, the dopant is selected from among aluminum, gallium, indium, and boron. When the transparent conductive film is made of tin oxide, the dopant is selected from among fluorine and antimony.

There are no particular restrictions on the method used to form the transparent conductive film in the present invention. The method can be selected from among vacuum deposition methods (electron-beam, resistance heating, high-frequency induction, laser-type vacuum deposition, etc.), ion plating methods, sputtering methods, and chemical vapor deposition methods (CVD methods).

In the film-forming method of the present invention, the transparent conductive film is formed on a substrate inside a vacuum chamber, after which the transparent conductive film is modified without being exposed to air. The substrate is not exposed to air until the modification process has been completed. The vacuum chamber used to form the film and the surface modifying device used to modify the film may be inside the same vacuum chamber, or may be in separate vacuum chambers, but must be configured such that the substrate is not exposed to air until the modification process has been completed.

The following is an explanation of an embodiment with reference to FIG. 1. The film-forming device 1 includes a vacuum chamber 10, and a material source 11 is included inside the vacuum chamber 10. The substrate 2 is transported in the direction of the arrows inside the vacuum chamber 10. A film-forming substance 3a released by the material source 11 adheres to the substrate 2 as it is being transported, forming a transparent conductive film 3 composed of a transparent conductive oxide such as indium oxide on the surface of the substrate 2.

The material source 11 is arranged so as to face the transported substrate 2, and a material such as indium oxide is contained inside a crucible. Energy from electron beam irradiation, resistance heating, high-frequency induction heating, laser irradiation or ion irradiation is imparted to the raw material of the material source 11, and the film-forming substance 3a is released from the material source 11 in the direction of the substrate 2, as indicated in the arrows of the drawing. The film-forming substance 3a adheres to the surface of the substrate 2, and transparent conductive film 3 is formed.

The vacuum chamber 10 is evacuated using a vacuum pump (not shown) from an exhaust port (not shown), and a predetermined degree of vacuum is maintained. Also, an atmospheric gas such as argon gas is supplied to the vacuum chamber 10. The supply of the atmospheric gas is controlled using a mass flow controller (not shown). The mass flow controller can be provided depending on the method used to apply energy to the raw material.

As, a cooling means (not shown) is provided on the outer periphery of the vacuum chamber 10, and the cooling means is controlled such that the outer wall of the vacuum chamber 10 is about 50° C.

In the present embodiment, as shown in FIG. 1, the substrate 2 is transported inside the vacuum chamber 10, and the transparent conductive film 3 is formed on the surface of the substrate 2 while the substrate 2 is being transported. Then, as explained below, radiant heat is imparted to the transparent conductive film 3 formed inside the vacuum chamber 10, and the transparent conductive film 3 is modified, after which the substrate 2 is removed from the vacuum chamber 10 and exposed to air.

As shown in FIG. 1, the surface modifying device 4 for imparting the heat is provided inside the vacuum chamber 10 near the substrate 2 on which the transparent conductive film 3 has been formed. This surface modifying device 4 is configured such that heat is imparted to the transparent conductive film 3 immediately after it has been formed.

In the present embodiment, the raw material in the material source 11 is heated and vaporized to create the film-forming substance 3a. The surface modifying device 4 consists of a metal plate 40 such as a stainless steel (SUS) plate or copper (Cu) plate, which is arranged on a wall surface of the vacuum chamber 10 and is arranged parallel to, and located near, the transported substrate 2. The metal plate 40 constituting the surface modifying device 4 is configured such that it is heated by radiant heat from the material source 11 to a temperature from 150° C. to 400° C. Electromagnetic waves from the heated metal plate 40 radiate towards the transparent conductive film 3 on the substrate 2, and the transparent conductive film 3 is heated. As a result, the grain size of the transparent conductive film 3 immediately after film formation is increased, the grain boundaries are reduced, and the transparent conductive film 3 is modified. Because the substrate 2 is not exposed to air until the modification of the transparent conductive film 3 has been completed, favorable film modification can be performed without the possibility of the surface of the transparent conductive film 3 being oxidized or other impurities adhering to the surface.

It is preferable that the electromagnetic waves emitted by the surface modifying device 4 selectively heat the transparent conductive film 3 formed on the surface of the substrate 2 and do not affect the substrate 2 itself. These electromagnetic waves are preferably not absorbed by any device other than the transparent conductive film 3 formed on the substrate 2.

Because the substrate 2 is shielded from the material source 11 by the surface modifying device 4 after the transparent conductive film 3 has been formed, the heating of the substrate 2 by radiant heat from the material source 11 is controlled. Therefore, when the substrate 2 has a semiconductor junction of amorphous silicon, the transparent conductive film 3 is modified without damaging the semiconductor junction of the substrate.

When the transparent conductive film 3 is formed on the substrate 2 using a sputtering method, the raw material target is held by the material source 11. The raw material target is then sputtered by being exposed to ions or radicals, and the film-forming substance 3a reaches the substrate 2 and forms a film. The metal plate 40 of the surface modifying device 4 is heated by plasma generated during film formation. Electromagnetic waves from the heated metal plate 40 are radiated onto the surface of the transparent conductive film 3 on the substrate 2, and the transparent conductive film 3 is heated. As a result, the grain size of the transparent conductive film 3 immediately after film formation is increased, the grain boundaries are reduced, and the transparent conductive film 3 is modified.

Figure 2:
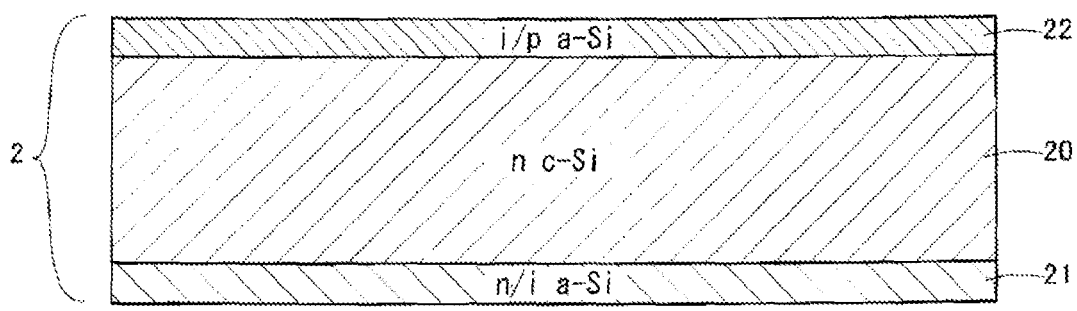
FIG. 2 is a schematic cross-sectional diagram showing the structure of a solar cell in an embodiment.

The transparent conductive film manufactured in the present embodiment can be used as a transparent electrode in a solar cell. FIG. 2 shows the configuration of a solar cell having the transparent conductive film formed using the manufacturing method in the present embodiment. The solar cell shown in FIG. 2 has a structure in which an intrinsic amorphous silicon layer is interposed between a single-crystal silicon substrate 20 and an amorphous silicon layer 22 having opposite types of conductivity. This configuration reduces the number of defects in the interface between the crystalline semiconductor substrate and the amorphous silicon layer, and improves the characteristics of the heterojunction interface.

Figure 3:
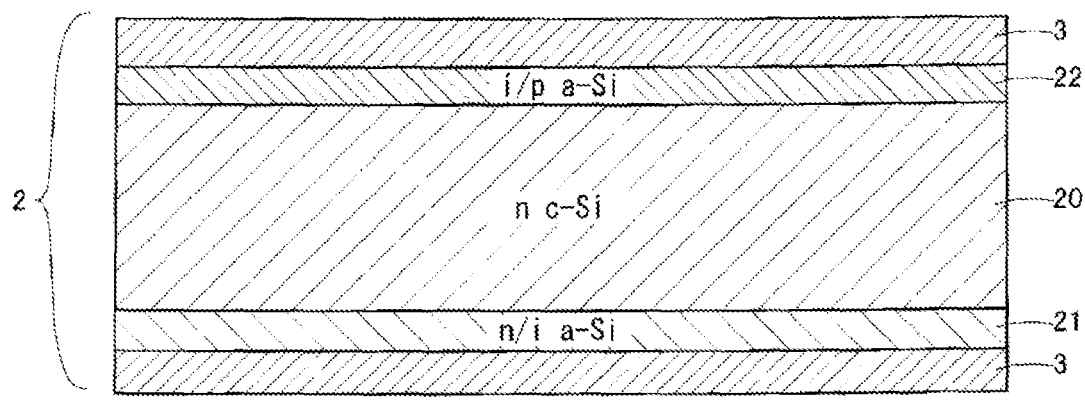
FIG. 3 is a schematic cross-sectional diagram showing the structure of a solar cell in an embodiment.

FIG. 3 is a schematic cross-sectional diagram showing the structure of a solar cell in an embodiment. In FIG. 3, an intrinsic (i-type) amorphous silicon layer and a p-type amorphous silicon layer (i/p a-Si) 22 are formed in successive order on one main surface of an n-type crystalline silicon (n c-Si) substrate 20 comprising a single-crystal silicon semiconductor, upon which a transparent conductive film 3 that comprises, for example, indium oxide with added tin, and a comb-shaped collector electrode (not shown) comprising silver (Ag) are further formed. An i-type amorphous silicon layer and an n-type amorphous silicon layer (n/i a-Si) 21 are laminated in successive order on another main surface of the crystalline silicon semiconductor 20, upon which a transparent conductive film 3 and a comb-shaped collector electrode (not shown) are further formed.

The transparent conductive film 3 in a solar cell with this configuration must be a film with few grain boundaries in order to improve performance and reliability. More specifically, the transparent conductive film 3 requires heightened resistance to sodium contained in the solar cell module. If the transparent conductive film 3 is formed in a solar cell with this configuration using the manufacturing method of the present embodiment, both performance and reliability are improved. In other words, the transparent conductive film 3 formed on the amorphous silicon layer 21 or 22 is modified by radiant heat from the surface modifying device 4, and both performance and reliability are improved.

In the film-forming method of the present embodiment, radiant heat is preferably imparted selectively to modify the transparent conductive film 3 without affecting the semiconductor junction of the amorphous silicon film formed in the crystalline silicon substrate 20. Therefore, the surface modifying device 4 is configured to radiate electromagnetic waves in a wavelength range that is not absorbed by the amorphous silicon film. When the temperature of the metal plate of the surface modifying device 4 is too high, the components of visible light increase (wavelength: 0.4 to 0.6 μm), and become visible to the naked eye (red hot). Because the electromagnetic waves in this wavelength range are absorbed by amorphous silicon, there is a possibility that the semi-conductor junction will be adversely affected.

Therefore, in the present invention, the metal plate 40 of the surface modifying device 4 is heated to a temperature from 160° C. to 400° C. According to Wien's displacement law, the peak wavelength of the electromagnetic waves radiated by the metal plate 40 of the surface modifying device 4 will be 6.69 µm at 160° C., 4.65 µm at 350° C., and 4.31 µm at 400° C. By heating the crystalline silicon substrate 20 on which transparent conductive film 3 has been formed using radiant heat from a metal plate 40 heated to these temperatures, the transparent conductive film 3 can be modified without heating the amorphous silicon.

Next, the characteristics were compared of solar cells with the structure shown in FIG. 3 in which the transparent conductive film 3 of one solar cell was modified using the metal plate of the surface modifying device 4, and the transparent conductive film 3 of the other solar cell was provided without using the metal plate 40 of the surface modifying device 4. The temperature of the metal plate 40 of the surface modifying device 4 was set to 150° C., and the radiant heat from the plate was imparted to the transparent conductive film 3. The results are shown in Table 1. In Table 1, the measured values have been standardized using the values from the sample without the metal plate. In the sample, a transparent conductive film 3 of indium oxide was formed using the sputtering method on a 104 mm-square solar cell.

TABLE 1

|  |  | Voc | Isc | FF | Pmax |
|---|---|---|---|---|---|
| With Metal Plate | Approx. 150° C. | 1.002 | 1.011 | 1.012 | 1.026 |
| Without Metal Plate | — | 1.000 | 1.000 | 1.000 | 1.000 |

By heating the transparent conductive film 3 using the metal plate 40 of the surface modifying device 4, the maximum output Pmax was increased by 2.6%. The short-circuit current (Isc) and fill factor (FF) were primarily improved. Heating and modifying the transparent conductive film 3 immediately after formation is believed to reduce the resistivity of the transparent conductive film by improving crystallinity and increasing the activation rate of the dopant.

Next, solar cells with the structure shown in FIG. 3 were tested for reliability by changing the temperature of the metal plate 40 of the surface modifying device 4 of the present embodiment during formation of the transparent conductive film 3. The results are shown in Table 2. A sample was prepared in which radiant heat was imparted to the transparent conductive film 3 at a temperature of 150° C., and another sample was prepared in which radiant heat was imparted to the transparent conductive film 3 at a temperature of 350° C. In the samples, a transparent conductive film 3 of indium oxide was formed using a sputtering method on a 125 mm-square solar cell.

The completed solar cell was sealed between a glass plate and PET sheet using an EVA sheet to complete a sample to be measured. In the test, the sample was kept for 1,000 hours at 85° C. and 85% relative humidity. The ratio of the post-testing maximum output Pmax to the pre-testing maximum output Pmax was determined. The results in Table 2 show the ratio for the minimum values (min.) and the average values (avg.) of the maximum output Pmax.

TABLE 2

|  |  | avg. Pmax | min. Pmax |
|---|---|---|---|
| With Metal Plate | Approx. 150° C. | 0.939 | 0.895 |
| With Metal Plate | Approx. 350° C. | 0.992 | 0.979 |

There was a difference in the test results due to the different temperatures used by the surface modifying device 4. The sample using the higher temperature had very little reduction in maximum output Pmax, and was found to be highly reliable. Modifying the transparent conductive film 3 immediately after formation is believed to result in an increase in the grain size of the transparent conductive film 3, a reduced grain boundary density, and a reduction in pathways for impurities to infiltrate into the amorphous silicon layer from the surface of the transparent conductive film 3. Therefore, processing in which the temperature of the metal plate 40 is increased within the wavelength range that does not affect the semiconductor junction of the amorphous silicon is desirable. The imparted electromagnetic waves should have a peak wavelength of 1,200 nm, preferably 1,500 nm, and more preferably 4 µm or greater. By keeping the temperature of the metal plate 40 of the surface modifying device 4 from 160° C. to 400° C., electromagnetic waves satisfying the conditions described above can be supplied to the transparent conductive film 3.

The surface modifying device 4 in the embodiment described above is composed of a metal plate 40 arranged near the substrate 2, which is heated by radiant heat from the material source 11. As a result, a heating device is not required for the metal plate 40, thereby simplifying the device. However, the surface modifying device 4 is not limited to this configuration. A device separate from the material source 11 that is set to a predetermined temperature by the surface modifying device 4 itself and emits far-infrared radiation can also be used. For example, a far-infrared lamp can be used.

In the embodiment described above, the vapor deposition source 11 and the surface modifying device 4 were provided inside the same chamber. However, film forming and film modifying can be performed in separate chambers. In this case, however, the system has to be configured such that the substrate 2 is not exposed to the air until modification of the transparent conductive film 3 has been completed.

The embodiment disclosed herein is for illustrative purposes in every respect, and it should be understood that the embodiment does not impose any restrictions on the present invention. The scope of the present invention is defined by the scope of the claims and not by the description of an embodiment above, and includes everything equivalent in meaning to the scope of the claims and all modifications therein.

KEY TO THE DRAWINGS

1: Film-forming device
10: Vacuum chamber
11: Material source
2: Substrate
20: Crystalline silicon substrate
3: Transparent conductive film
4: Surface modifying device
40: Metal plate

What is claimed is:
1. A method for manufacturing a transparent conductive film, the method comprising:

forming the transparent conductive film on a substrate inside a vacuum chamber; and modifying the transparent conductive film with a surface modifying device that emits radiant heat without exposing the transparent conductive film to the atmosphere, wherein the surface modifying device is positioned near the substrate inside the vacuum chamber and interposed between a material source and the substrate surface, to allow the radiant heat to irradiate the transparent conductive film formed on the substrate.

2. The method for manufacturing the transparent conductive film according to claim 1, wherein the surface modifying device comprises a metal plate that receives radiant heat energy from the surface modifying device to produce electromagnetic waves of 6.69 to 4.31 microns, and wherein the 6.69 to 4.31 micron electromagnetic waves from the metal plate selectively modify the transparent conductive film.

3. The method for manufacturing the transparent conductive film according to claim 1,
wherein the substrate comprises a semiconductor junction that comprises an amorphous silicon film, and wherein the transparent conductive film is formed on the amorphous silicon.

4. The method for manufacturing the transparent conductive film according to claim 3, wherein the surface modifying device emits electromagnetic waves in a wavelength range not absorbed by the substrate.

5. The method for manufacturing the transparent conductive film according to claim 4, wherein the surface modifying device comprises a metal plate, and the metal plate is heated to a temperature from 160° C. to 400° C.

6. The method for manufacturing the transparent conductive film according to claim 1, wherein the surface modifying device heats the substrate surface by electromagnetic energy having a peak emission wavelength that exceeds 1200 nm.

7. The method of claim 6, wherein the surface modifying device heats the substrate surface by electromagnetic energy having a peak emission wavelength that exceeds 4 microns.

8. A manufacturing method for a solar cell comprising:
preparing a substrate having a semiconductor junction;
forming a transparent conductive film on the substrate inside a vacuum chamber, and
modifying the transparent conductive film without exposing the transparent conductive film to the atmosphere with a surface modifying device that is interposed between a material source and the substrate surface.

9. The manufacturing method for a solar cell according to claim 8, wherein the substrate comprises an amorphous silicon layer.

10. A method for manufacturing a transparent conductive film, the method comprising:
forming a transparent conductive film on a surface of a substrate that is held within a vacuum chamber by exposing the substrate surface directly to a heated material source such that a film-forming substance released from the material source adheres to the exposed surface of the substrate at a first position within the vacuum chamber;
transporting the substrate to a second position within the chamber wherein the surface with transparent conductive film thereon is blocked from direct exposure to the material source by a surface modifying device that is interposed between the material source and the substrate surface,
wherein the surface modifying device is parallel to the substrate and is heated directly by the heated material source.

11. The method of claim 10, wherein the surface modifying device heats the transparent conductive film more than the substrate.

12. The method of claim 11, wherein the surface modifying device comprises a plate that radiantly heats the transparent conductive film to between 160° C. and 400° C. while blocking the transparent conductive film from direct heat from the heated material source.

13. The method of claim 10, wherein the surface modifying device comprises a metal plate that is heated to a temperature of from 160 to 400 degrees Centigrade.

14. The method of claim 10, wherein the surface modifying device heats the substrate surface by electromagnetic energy having a peak emission wavelength that exceeds 1200 nm.

15. The method of claim 10, wherein the surface modifying device heats the substrate surface by electromagnetic energy having a peak emission wavelength that exceeds 4 microns.

16. The method of claim 10, wherein
the heated surface modifying device emits far-infrared radiation, and
wherein the surface modifying device is parallel to the substrate and heats the transparent conductive film to between 160 to 400 degrees Centigrade.

17. The method of claim 16, wherein the transparent conductive film is an outer layer of a solar cell comprising a PN junction made from an amorphous silicon layer.

* * * * *